(12) United States Patent
Kronholz et al.

(10) Patent No.: US 7,691,433 B2
(45) Date of Patent: Apr. 6, 2010

(54) METHOD FOR STRUCTURED APPLICATION OF MOLECULES TO A STRIP CONDUCTOR AND MOLECULAR MEMORY MATRIX

(75) Inventors: Stephan Kronholz, Dresden (DE); Silvia Karthäuser, Köln (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 11/793,126

(22) PCT Filed: Nov. 30, 2005

(86) PCT No.: PCT/DE2005/002157

§ 371 (c)(1),
(2), (4) Date: Jun. 12, 2007

(87) PCT Pub. No.: WO2006/063553

PCT Pub. Date: Jun. 22, 2006

(65) Prior Publication Data

US 2008/0220229 A1    Sep. 11, 2008

(30) Foreign Application Priority Data

Dec. 15, 2004    (DE) .................. 10 2004 060 738

(51) Int. Cl.
| | |
|---|---|
| B05D 5/12 | (2006.01) |
| B28B 19/00 | (2006.01) |
| B29B 15/10 | (2006.01) |
| C23C 18/00 | (2006.01) |
| C23C 20/00 | (2006.01) |
| C23C 24/00 | (2006.01) |
| C23C 26/00 | (2006.01) |

(52) U.S. Cl. .................. 427/96.2; 427/98.1; 427/96.1; 427/99.1; 427/301; 427/304; 428/208; 216/56; 438/1; 438/3; 438/99; 438/781

(58) Field of Classification Search .......... 427/98.1, 427/99.1, 301, 304, 96.1, 96.2; 428/209; 216/56; 438/1, 3, 99, 781
See application file for complete search history.

(56) References Cited

U.S. PATENT DOCUMENTS

| | | | |
|---|---|---|---|
| 6,159,620 A | 12/2000 | Heath et al. .................. 428/615 |
| 6,773,954 B1 * | 8/2004 | Subramanian et al. ......... 438/99 |
| 7,387,967 B2 | 6/2008 | Ogawa et al. ............... 438/706 |
| 2002/0016306 A1 * | 2/2002 | Hutchison et al. ............. 514/44 |
| 2003/0169618 A1 | 9/2003 | Lindsey et al. .............. 365/151 |
| 2004/0166673 A1 | 8/2004 | Hutchison et al. ........... 438/686 |

OTHER PUBLICATIONS

Spatz et al. (Langmuir 2000, 16, 407-415).*

* cited by examiner

*Primary Examiner*—Nadine G Norton
*Assistant Examiner*—Mahmoud Dahimene
(74) *Attorney, Agent, or Firm*—Andrew Wilford

(57) ABSTRACT

The invention relates to a method for a structured application of molecules on a strip conductor and to a molecular memory matrix. The inventive method makes it possible, for the first time, to economically and simply apply any number of molecular memory elements on the strip conductor in a structured and targeted way, thereby making available, also for the first time, a memory matrix at a molecular level.

11 Claims, 2 Drawing Sheets

METHOD FOR STRUCTURED APPLICATION OF MOLECULES TO A STRIP CONDUCTOR AND MOLECULAR MEMORY MATRIX

CROSS REFERENCE TO RELATED APPLICATIONS

This application is the U.S. national phase of PCT application PCT/DE2005/002157, filed 30 Nov. 2005, published 22 Jun. 2006 as WO2006/063553, and claiming the priority of German patent application 102004060738.9 itself filed 15 Dec. 2004, whose entire disclosures are herewith incorporated by reference.

FIELD OF THE INVENTION

The invention relates to a method for the structured application of molecules to a conductive trace, and to a molecular memory matrix.

BACKGROUND OF THE INVENTION

In the field of molecular electronics, methods are known such as the nanogap method (C. Li, I-I. He, N. J. Tao, Applied Physics Letters 77, 3995 (2000)) and the break junction method (M. A. Reed, C. Zhou, C. J. Muller, T. P. Burgin, and J. M. Tour, Science 278, 252 (1997), for example, by means of which individual molecules may be contacted. Other methods consist in contacting molecules as a monomolecular layer. One method for the application of molecules as a monomolecular layer involves immersing the substrate (desired carrier for the molecular layer) in a bath composed of molecules and solvent. The Langmuir-Blodgett method (H. Wang, A. Reichert, J. O. Nagy, Langmuir 13, 6524 (1997)) may also be used for producing monomolecular layers.

In the use of monomolecular layers it is disadvantageous that only complete layers or layer systems can be formed and contacted. This makes it impossible to address individual molecules. Production of a molecular memory matrix by using this method is possible only with great difficulty, since significant effort is required to structure the applied molecular layer. The structural size always depends on the particular structuring method that is the best at the given time. Currently this method is electron beam lithography, by means of which structuring down to 2 nm may be achieved. However, this is a time-consuming sequential method that cannot be used to advance into the region of individual molecules.

Structuring of monomolecular layers entails the risk that the molecules provided as memory elements may be impaired. It is also disadvantageous that molecules applied using the Langmuir-Blodgett method do not form chemical bonds with the electrons. This results in a high molecule-electrode contact resistance and low stability of the molecular layer. It is likewise not possible, using the nanogap method or the break junction method, to form a switching matrix composed of a large number of molecular memory elements.

In principle, it is not possible to use of the above-mentioned methods to integrate multiple molecular contact sites into an nm-dimensional memory matrix. Furthermore, some matrix systems always require two electrode pairs: one pair for "addressing" and one pair for "reading" the information within the molecule. Thus, at present there are only various methods for individual molecules in a targeted manner, but only as individual molecular contact, not as an array.

According to the prior art, thin gold films on mica or gold monocrystals have been used heretofore as bottom electrodes for the contacting of molecules. This is based on the fact that these bottom electrodes provide a low, well reproducible surface roughness, with the gold-sulfur contact being preferred. However, this has the disadvantage that the prevailing CMOS process, in which silicon is used as substrate, cannot be employed.

OBJECT OF THE INVENTION

The object of the invention, therefore, is to provide an improved method for the structured application of molecules to a conductive trace, and also to provide a molecular memory matrix, by means of which the above-referenced disadvantages may be overcome.

SUMMARY OF THE INVENTION

Proceeding from the preamble of claim 1, the object is achieved according to the invention in a method having the following steps:
application of micelles containing incorporated metallic clusters to a structured conductive trace;
removal of the polymer chains of the micelles around the metallic clusters;
imbedding of the metallic clusters into an electrically insulating protective layer;
uncovering of the metallic clusters for functional molecules; and
bonding of the functional molecules to the metallic clusters.

By use of the method according to the invention it is possible for the first time to economically and simply apply any given number of molecules, i.e. molecular memory elements, to a conductive trace in a structured and targeted manner, thereby providing for the first time a memory matrix on the molecular level. By use of the memory matrix according to the invention, it is now possible to achieve a very high storage density that cannot be attained using storage media known heretofore.

BRIEF DESCRIPTION OF THE DRAWING

The drawings schematically show one of many possible embodiments of the method according to the invention, namely:

FIG. 1 schematically shows by way of example the possible method steps for the structured application of molecules to a conductive trace and for producing a molecular memory matrix. More particularly:

Figure 1:
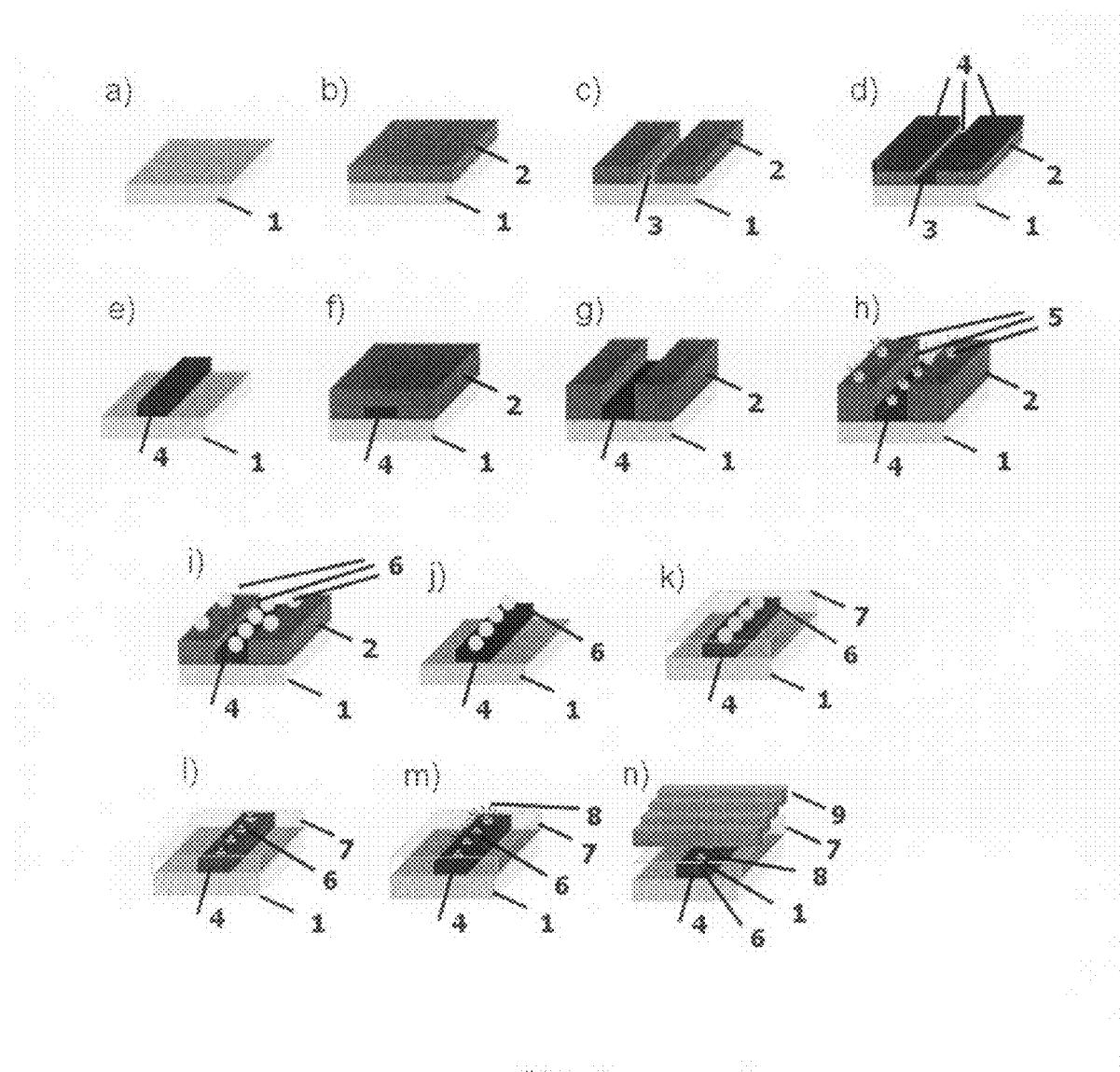
FIG. 1 shows method steps for the structured application of molecules to a conductive trace.

Step a) shows the substrate 1.
Step b) shows the substrate 1 coated with photoresist 2.
Step c) shows the desired structure 3 produced in the photoresist 2.
Step d) shows the layer applied to the structured photoresist that is intended as the conductive trace 4.
Step e) shows the conductive trace 4 remaining on the substrate 1 after the "lift-off."
Step f) shows the photoresist 2 sputtered over the conductive trace 4 and the substrate 1.
Step g) shows the conductive trace 4 stripped of the photoresist 2 by means of the known structuring method.
Step h) shows the micelles 5 applied to the conductive trace 4 and the photoresist 2.

Step i) shows the metallic clusters 6 from which the polymer chains have been removed by plasma etching, for example, and which may be used as anchor sites for molecules.

Step j) shows the conductive trace 4 uncovered by the "lift-off" and coated by the metallic clusters 6.

Step k) shows the conductive trace 4 covered by a protective layer 7, and the covered substrate 1.

Step l) shows the metallic clusters 6 uncovered on the protective layer 7 by etching.

Step m) shows the functional molecules 8 associated with the uncovered anchor sites for the metallic clusters 6.

Step n) shows the top electrodes 9, applied by printing, for example, on top of the metallic clusters 6 embedded in the protective layer 7 on the substrate 1, together with the bound functional molecules 8.

Figure 2:
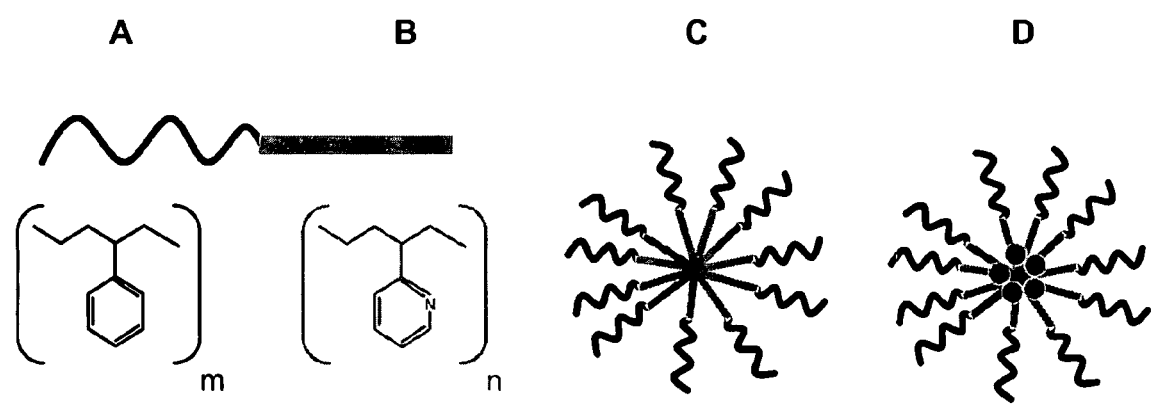
FIG. 2 shows the structure of micelles and the composition thereof.

FIG. 2 shows the structure of micelles and the composition thereof, comprising a hydrophobic (A) and a hydrophilic (B) molecular portion, where "m" indicates the number of hydrophobic molecular portions and "n" the number of hydrophilic molecular portions. Micelle formation (C) occurs in a non-polar solvent. (D) shows a micelle loaded with metallic clusters.

The individual method steps are described below in greater detail by way of example, method steps a) through e) reflecting several methods known from the prior art for structuring conductive traces. The method according to the invention for the structured application of molecules to a conductive trace is explained, beginning with step f).

The substrate 1 (step a), which is composed of silicon, the most prevalent material used in the CMOS process, is first coated by means of sputtered-on deposition with photoresist 2 (step b). A portion of the photoresist 2 is then irradiated (step c), resulting in a desired structure, such as a narrow track 3 having, for example, a width of approximately 2 to 20 nm, for a conductive trace 4 in the layer of the photoresist 2 after subsequent developing. This may be achieved by electron beam lithography, for example, but all known direct and indirect methods are likewise suitable that permit application of a structured conductive trace. By use of the methods known from the prior art it is possible to incorporate any given desired structure or surface into the layer of the photoresist 2, and thus also to use any given structures as conductive trace 4.

In the next step the material for the conductive trace 4 is applied to the structure 3 uncovered by lithography and to the remaining surface of the photoresist 2 (step d). Known methods such as vapor deposition or sputtering, for example, may be used. The conductive trace 4 must meet a basic condition of good electrical conductivity. For this reason, materials such as gold, copper, aluminum, or platinum, for example, should be used. In the next method step (also referred to as lift-off) (step e), the layer of the photoresist 2 together with the applied material for the conductive trace 4 is removed from the substrate 1 by treatment with a solvent such as acetone, so that only the conductive trace 4 resting directly on the substrate 1 remains. A layer of photoresist 2 is once again sputtered onto the substrate 1 and the conductive trace 4 (step f). In the next method step (step g) the layer of the photoresist 2 on the conductive trace 4 is once again removed, for example by an electron beam and subsequent developing, and the conductive trace 4 is uncovered. By immersion of this system in a solution containing micelles 5 loaded with metallic ions or clusters 6, for example gold ions or gold clusters, the micelles 5 are deposited on the photoresist 2 as well as directly on the conductive trace 4 (step h).

Micelles 5 comprise amphiphilic molecules composed of a hydrophobic and a hydrophilic molecular part that in a non-polar solvent such as toluene form micelles 5 (J. Spatz, M. Möler, P. Ziemann, Phys. Blätter 55, 49 (1999)).

Many different types of metals such as gold, platinum, palladium, titanium, indium, silver, copper, gallium, or other desired metallic clusters may be incorporated into the nuclei of these micelles 5. Within the scope of the present invention, the term "clusters" is understood to mean clusters composed of several metal atoms as well as an accumulation of metal ions that may be converted to clusters by reduction. After the polymers are removed, for example by treatment with a reactive plasma (referred to as plasma etching), the polymers are evaporated or chemically removed, depending on the strength and type of plasma (step i). As a result of this evaporation process, only the metallic clusters 6 in the micelles remain on the conductive trace 4 or the photoresist layer. In the next step (step j) the photoresist 2 is dissolved by treatment with solvent (acetone, for example), so that only the conductive trace 4 together with the stably bonded metallic clusters 6, such as gold clusters, remain. In the next step (step k) the individual metallic clusters 6, which later are used as anchor sites for molecules, are electrically insulated from one another by applying a protective layer 7 composed of electrically insulating materials such as silicon oxide, for example, and are protected from further direct environmental influences. By treating the surface by use of an ablative method such as reactive ion beam etching (RIBE), for example, the protective layer 7 over the metallic clusters 6 is removed so that the outer surfaces of the metallic clusters 6 are accessible (step l). The functional molecules 8 are then applied to these metallic clusters 6 (step m). This may be achieved, for example, by immersion in a solution enriched with molecules, or also by vapor deposition of molecules from the gaseous phase. The functional molecules 8 may be bonded to the anchor sites of the metallic clusters 6 by means of gold-sulfur bridge bonds, for example. The method is concluded by applying the top electrode 9, for example by printing.

The present invention therefore relates to a method for the structured application of molecules to a conductive trace, comprising the following method steps: Application of micelles 5 containing incorporated metallic clusters 6 to a structured conductive trace 4; Removal of the polymer chains of the micelles 5 around the metallic clusters 6; Imbedding the metallic clusters 6 in an electrically insulating protective layer 7; Uncovering the metallic clusters 6 for functional molecules 8; and Bonding the functional molecules 8 to the metallic clusters 6.

The spacing of the metallic clusters 6 from one another may be directly set in a defined manner by varying the length of the polymer chains in the molecules forming the micelles 5. The number of functional molecules 8 per metallic cluster 6 may be set in a defined manner by virtue of the size of the uncovered metallic cluster 6 (i.e. by the size of the metallic cluster 6 as well as by the size of the uncovered cross section of the metallic cluster 6). Since the micelles 5 are able to arrange themselves in an ordered manner on the structured conductive trace, complicated and expensive method steps for structuring the memory matrix may be omitted. It is thus possible to economically and simply develop an ultimately dense memory matrix whose point density is limited only by the molecular dimensions of the functional molecules.

In a further advantageous embodiment of the method, conductive traces 4 having different widths are produced on the substrate surface. In addition, micelles 5 having various sizes and differently loaded metallic clusters 6 are used.

The size of the micelles 5 may be set by means of the hydrophobic and hydrophilic portions of the micelles 5. As a result, the micelles 5 are positioned corresponding to their size only in the previously structured conductive traces of differing widths or corresponding surfaces provided for this purpose. For example, wide conductive traces 4 are first occupied by application of "large" micelles 5. "Small" micelles 5 are then loaded with other metallic clusters and incorporated into narrow conductive traces 4. Thus, many different types of metallic clusters 6 may be applied in a structured manner to a single substrate surface. In one advantageous embodiment of the method, at least one component of the group Au, Pt, Pd, Ti, Fe, In, Ag, Co, and/or Ga may be used as metallic clusters 6. The differently sized metallic clusters 6 are ordered according to the size of the micelles 5 on the differently sized surfaces or widths of the conductive traces 4. This has the advantage that even molecules having different switching capabilities and containing correspondingly different anchor groups are able to selectively bond to the metallic clusters that are positioned in a defined manner (for example, molecules containing COOH anchor groups are bonded to Ti clusters, and molecules containing SH anchor groups are bonded to gold clusters). This has the advantage that different (at least two different) functional molecules 8 may selectively and specifically bond to the predefined various anchor sites of the metallic clusters 6, thus allowing a memory matrix having differently definable properties to be constructed.

One advantageous embodiment of the method is characterized in that micelles 5 containing polymer chains of different lengths are used. Thus, for example, micelles 5 containing polymer chains between 10 and 200 nm may be used. This allows the point density for the functional molecules 8, which, for example, may be between approximately $10^9$ and $10^{11}$ molecular memory elements/mm$^2$, to be set in a defined manner.

In a further advantageous embodiment of the method, metallic clusters 6 of different sizes are used. Thus, the number of functional molecules 8 per area may be set in a defined manner. The metallic clusters 6 may have a diameter of 0.5-20 nm, for example. Since the functional molecules 8 may occupy an area of 0.1 to 1.5 nm$^2$, approximately 1-3500 functional molecules 8 may bond to the anchor sites of the metallic clusters 6, depending on the diameters of the metallic clusters 6.

In one advantageous embodiment of the method, the accessibility of the surface of the metallic clusters 6 and thus the number of anchor sites per metallic cluster 6 is varied via the etching process. The more surface of the metallic clusters 6 that is uncovered from the protective layer, the more anchor sites are available to the functional molecules 8. A further possibility is thus provided for setting the number of functional molecules 8 on the metallic cluster 6 in a defined manner.

One advantageous embodiment of the method includes the use of functional molecules 8 that react upon changes in the electrical field or the electromechanical conditions, changes in the light and/or the electrochemical conditions together with a change in the charge density or electron configuration, a conformational change or movement of an atomic group, an excited state of an electron, and/or a change in the magnetic spin.

The advantage of the method according to the invention is that functional molecules usable as memory elements (molecular memory elements) may be applied in bundles of a few molecules (1-N, N<100 and preferably N~2-10, where N equals the number of molecules), the numbers of which are specified by the size of the anchor sites, at defined spacings of 10-200 nm, to conductive traces of any given material. Only in this manner is it possible to make use of the discrete energy levels of the individual molecules for memories or switching elements.

Additional method steps may be added without adversely affecting the method, if this is expedient for carrying out the method.

The subject matter of the present invention is furthermore a molecular memory matrix produced by the method according to the invention.

The invention claimed is:

1. A method for the structured application of molecules to a structured conductive trace, the method comprising the steps of sequentially:
    applying micelles containing incorporated metallic clusters to a structured conductive trace;
    removing polymer chains of the micelles around the metallic clusters incorporated in the micelles;
    applying an electrically insulating protective layer over the metallic clusters from around which polymer chains have been removed so as to embed the metallic clusters;
    removing the electrically insulating protective layer from over the metallic clusters and thereby uncovering the metallic clusters; and
    bonding functional molecules to the uncovered metallic clusters.

2. The method defined in claim 1 wherein before applying micelles to the conductive trace, a surface of the conductive trace at least as large as the micelles to be applied to it is exposed, the micelles containing incorporated metallic clusters then being applied to the exposed surface of the conductive trace.

3. The method defined in claim 1 wherein at least one component of the group Au, Pt, Pd, Ti, Fe, In, Ag, Co, or Ga is used as metallic clusters.

4. The method defined in claim 1 wherein the micelles are applied by immersing a substrate carrying the conductive trace in a solution containing the micelles.

5. The method defined in claim 1 wherein micelles containing polymer chains of different lengths are used.

6. The method defined in claim 1 wherein micelles containing polymer chains between 10 nm and 200 nm are used.

7. The method defined in claim 1 wherein metallic clusters having a size of 0.5-20 nm are used.

8. The method defined in claim 1 wherein the size of anchor sites of the metallic clusters is varied by use of an etching process.

9. The method defined in claim 1 wherein functional molecules are used that react upon changes in an electrical field, an electromechanical condition, light, or electrochemical conditions, a change in a charge density or electron configuration, a conformational change or movement of an atomic group, an excited state of an electron, or a change in the magnetic spin.

10. A method for the structured application of molecules to a structured conductive trace, the method comprising the steps of:
    applying micelles containing incorporated metallic clusters to a structured conductive trace;
    removing polymer chains of the micelles;
    applying an electrically insulating protective layer over the metallic clusters so as to embed the metallic clusters;
    removing the electrically insulating protective layer from over the metallic clusters and thereby uncovering the metallic clusters;
    bonding functional molecules to the uncovered metallic clusters; and applying top electrodes to the functional molecules bonded to the uncovered metallic clusters with a relative spacing between top electrodes generally equal to a polymer-chain length of the micelles.

11. A method for the structured application of molecules to a structured conductive trace, the method comprising the steps of sequentially:

applying micelles containing incorporated metallic clusters to a structured conductive trace;

removing polymer chains of the micelles around the metallic clusters incorporated in the micelles;

applying an electrically insulating protective layer over the metallic clusters from around which polymer chains have been removed so as to embed the metallic clusters;

removing the electrically insulating protective layer from over the metallic clusters and thereby uncovering the metallic clusters;

bonding of functional molecules to the uncovered metallic clusters; and applying top electrodes to the functional molecules bonded to the uncovered metallic clusters with a relative spacing between top electrodes generally equal to a polymer-chain length of the micelles.

\* \* \* \* \*